(12) United States Patent
Takata

(10) Patent No.: US 11,558,035 B2
(45) Date of Patent: Jan. 17, 2023

(54) MULTIPLEXER

(71) Applicant: Murata Manufacturing Co., Ltd., Nagaokakyo (JP)

(72) Inventor: Toshiaki Takata, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 176 days.

(21) Appl. No.: 16/886,832

(22) Filed: May 29, 2020

(65) Prior Publication Data
US 2020/0295737 A1 Sep. 17, 2020

Related U.S. Application Data

(63) Continuation of application No. PCT/JP2018/042779, filed on Nov. 20, 2018.

(30) Foreign Application Priority Data

Dec. 4, 2017 (JP) .............................. JP2017-232655

(51) Int. Cl.
*H03H 9/72* (2006.01)
*H03H 9/145* (2006.01)
(Continued)

(52) U.S. Cl.
CPC .............. *H03H 9/72* (2013.01); *H03H 9/145* (2013.01); *H03H 9/25* (2013.01); *H03H 9/6483* (2013.01)

(58) Field of Classification Search
CPC ............ H03H 9/72; H03H 9/145; H03H 9/25; H03H 9/6483
See application file for complete search history.

(56) References Cited

U.S. PATENT DOCUMENTS

2006/0055485 A1* 3/2006 Lobeek .................. H03H 9/706
333/133
2012/0274416 A1* 11/2012 Hara ..................... H03H 9/725
333/195
(Continued)

FOREIGN PATENT DOCUMENTS

JP 2014-082609 A 5/2014
WO 2014/034373 A1 3/2014
(Continued)

OTHER PUBLICATIONS

Machine Translation of WO2015098240 (Year: 2015).*
Official Communication issued in International Patent Application No. PCT/JP2018/042779, dated Jan. 29, 2019.

*Primary Examiner* — Samuel S Outten
(74) *Attorney, Agent, or Firm* — Keating & Bennett, LLP

(57) ABSTRACT

A multiplexer includes a common terminal, a first terminal, a second terminal, a first filter device including acoustic wave resonators including series resonators and parallel resonators, an inductor provided between an acoustic wave resonator and the first terminal, and a second filter device. The first filter device further includes a first ground terminal to which a parallel resonator is electrically connected, a second ground terminal to which the parallel resonators are electrically connected, and a wiring provided between the inductor and an acoustic wave resonator. In the first filter device, the wiring is electrically connected to the first ground terminal, and the first ground terminal is not connected to the second ground terminal.

18 Claims, 9 Drawing Sheets

(51) Int. Cl.
*H03H 9/25* (2006.01)
*H03H 9/64* (2006.01)

(56) References Cited

U.S. PATENT DOCUMENTS

| | | | |
|---|---|---|---|
| 2013/0049882 A1* | 2/2013 | Yamashita | H04B 1/525 |
| | | | 333/133 |
| 2015/0137909 A1 | 5/2015 | Okuda et al. | |
| 2017/0077896 A1 | 3/2017 | Sugaya et al. | |
| 2019/0044496 A1 | 2/2019 | Takamine | |

FOREIGN PATENT DOCUMENTS

| | | |
|---|---|---|
| WO | 2015/098240 A1 | 7/2015 |
| WO | 2016/136413 A1 | 9/2016 |
| WO | 2017/179253 A1 | 10/2017 |

\* cited by examiner

MULTIPLEXER

CROSS REFERENCE TO RELATED APPLICATIONS

This application claims the benefit of priority to Japanese Patent Application No. 2017-232655 filed on Dec. 4, 2017 and is a Continuation Application of PCT Application No. PCT/JP2018/042779 filed on Nov. 20, 2018. The entire contents of each application are hereby incorporated herein by reference.

BACKGROUND OF THE INVENTION

1. Field of the Invention

The present invention relates to a multiplexer including a plurality of filter devices.

2. Description of the Related Art

In mobile phones in recent years, it is required to cope with a plurality of frequency bands and a plurality of radio systems in one terminal, that is, multiband compatibility and multimode compatibility. In order to cope with this, a multiplexer for demultiplexing high-frequency signals having a plurality of radio carrier frequencies is arranged in one antenna.

As an example of a filter device included in a multiplexer of this type, Japanese Unexamined Patent Application Publication No. 2014-82609 discloses a filter device including a plurality of series resonators and a plurality of parallel resonators. In this filter device, a shield surrounds the series resonator and the parallel resonator in order to increase isolation with other filter devices.

However, in the filter device disclosed in Japanese Unexamined Patent Application Publication No. 2014-82609, since a shield is formed around the entire periphery of the filter device, there is a problem in that the sizes of the filter device and the multiplexer are increased.

SUMMARY OF THE INVENTION

Preferred embodiments of the present invention provide improved isolation between filter devices in multiplexers and significantly reduces the size of a multiplexer.

A multiplexer according to a preferred embodiment of the present invention includes a common terminal, a first terminal, and a second terminal; a first filter device including a plurality of acoustic wave resonators including one or more series resonators provided on a first path electrically connecting the common terminal and the first terminal, and two or more parallel resonators provided on one or more second paths electrically connecting a node on the first path and a ground; an inductor provided between an acoustic wave resonator closest to the first terminal among the plurality of acoustic wave resonators and the first terminal, on the first path; and a second filter device provided on a third path electrically connecting the common terminal and the second terminal, in which the first filter device further includes a first ground terminal to which a first parallel resonator closest to the first terminal among the two or more parallel resonators is electrically connected, on the first path; a second ground terminal to which a second parallel resonator different from the first parallel resonator among the two or more parallel resonators is electrically connected; and a wiring provided between the inductor and the plurality of acoustic wave resonators when the first filter device is viewed in a plan view, and in the first filter device, the wiring is electrically connected to the first ground terminal, and the first ground terminal is not connected to the second ground terminal.

By providing the wire as a shield between the inductor and the acoustic wave resonator as described above, the electromagnetic field coupling between the inductor and the acoustic wave resonator is able to be significantly reduced or prevented, and unnecessary waves generated outside the pass band of the first filter device are able to be significantly reduced or prevented. Accordingly, the unnecessary wave is able to be significantly reduced or prevented from being transmitted to the second filter device, and isolation in the pass band of the second filter device is able to be improved. Further, since the shield wire is provided between the inductor and the acoustic wave resonator, the multiplexer is able to be significantly reduced in size as compared with a case where a shield surrounds the entire circumference of the acoustic wave resonator, for example.

Additionally, an acoustic wave resonator closest to the first terminal is a first series resonator closest to the first terminal among the one or more series resonators, and the shield wire may be provided between the inductor and the first series resonator when the first filter device is viewed in a plan view.

Accordingly, by providing the shield wire between the inductor and the first series resonator which is electrically connected in series to the inductor and is easy to be in a state of electromagnetic field coupling, the coupling between the inductor and the first series resonator is able to be significantly reduced or prevented. Accordingly, the isolation in the pass band of the second filter device is able to be significantly increased.

Additionally, the shield wire may intersect with a straight line connecting the inductor and the plurality of acoustic wave resonators when the first filter device is viewed in a plan view.

Thus, the electromagnetic field coupling between the inductor and the acoustic wave resonator is able to be significantly reduced or prevented. Accordingly, the isolation in the pass band of the second filter device is able to be significantly increased.

Additionally, the multiplexer may further include a multilayer substrate, the common terminal, the first terminal, and the second terminal may be provided on the multilayer substrate, and the first filter device, the inductor, and the second filter device may be mounted on one main surface of the multilayer substrate.

As described above, even when the first filter device and the inductor are mounted on the same or substantially the same plane, the isolation in the pass band of the second filter device is able to be improved.

Additionally, the first filter device may include a substrate having piezoelectricity, and the shield wire and the first ground terminal may be provided on one main surface of the substrate.

Thus, the shield wire is able to be electrically connected to the first ground terminal with a simple routing of wiring, and the multiplexer is able to be significantly reduced in size.

Additionally, between the first filter device and the inductor, another electronic component different from the first filter device and the inductor may not be mounted, and the first filter device and the inductor may be adjacent to each other.

Thus, even when the inductor and the first filter device are provided adjacent to or in a vicinity of each other, the electromagnetic field coupling between the inductor and the acoustic wave resonator is able to be significantly reduced or prevented. Accordingly, the isolation in the pass band of the second filter device is able to be improved.

Additionally, the inductor may be electrically connected between a power amplifier electrically connected to the first terminal and the first filter device.

Accordingly, even when the power amplifier is electrically connected to the inductor and a large current flows through the inductor, the electromagnetic field coupling between the inductor and the acoustic wave resonator is able to be significantly reduced or prevented. Accordingly, the isolation in the pass band of the second filter device is able to be improved.

Additionally, the inductor may be a chip inductor or a wire-wound inductor.

Even when the inductor is a chip inductor or a wire-wound inductor having a large inductance value, for example, the electromagnetic field coupling between the inductor and the acoustic wave resonator is able to be significantly reduced or prevented. Accordingly, the isolation in the pass band of the second filter device is able to be improved.

Additionally, each of the first filter device and the inductor may have a rectangular or substantially rectangular shape when viewed in a plan view, and a long side of the inductor may be parallel or substantially parallel to a long side or a short side of the first filter device.

Accordingly, the multiplexer is able to be significantly reduced in size.

Additionally, the first filter device may be a transmission filter, and the second filter device may be a reception filter.

Thus, the above-described multiplexer may be used as a duplexer.

According to preferred embodiments of the present invention, isolation between filter devices in multiplexers is able to be improved and the multiplexer is able to be significantly reduced in size.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
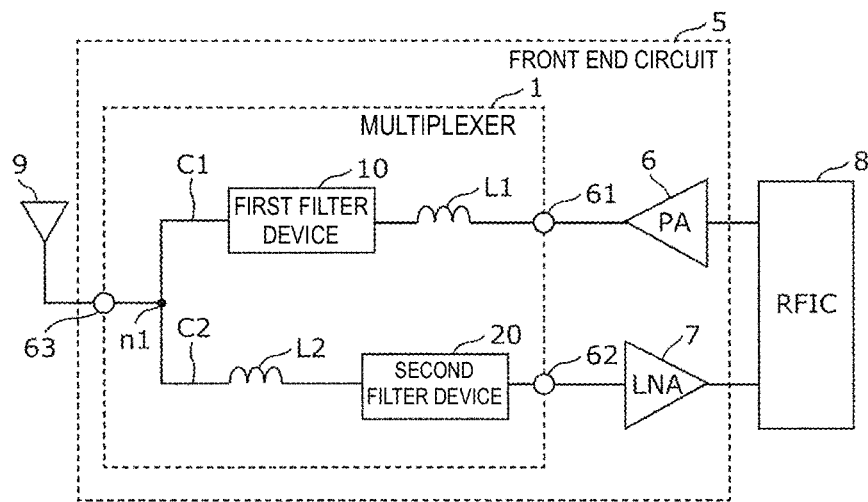
FIG. 1 is a diagram showing a front end circuit including a multiplexer according to a preferred embodiment of the present invention.

Hereinafter, preferred embodiments of the present invention will be described in detail with reference to the drawings. Note that the preferred embodiments described below are inclusive or specific examples. Numerical values, shapes, materials, elements, arrangement and connection configurations of the elements described in the following preferred embodiments, and the like are examples, and are not intended to limit the present invention. Among the elements in the following preferred embodiments, elements not described in the independent claims will be described as arbitrary or optional elements. Also, sizes or size ratios of the elements shown in the drawings are not necessarily strict.

1. Circuit Configuration of Multiplexer

A multiplexer according to a preferred embodiment of the presented invention is included in a communication device, for example, a cellular phone. In the present preferred embodiment, a duplexer of Band 25 (transmission pass band: about 1850 MHz to about 1915 MHz, reception pass band: about 1930 MHz to about 1995 MHz) will be described as an example of a multiplexer. FIG. 1 is a diagram showing a front end circuit 5 including a multiplexer 1 according to the present preferred embodiment.

As shown in FIG. 1, the multiplexer 1 includes a first filter device 10, an inductor L1, a second filter device 20, and an inductor L2. Further, the multiplexer 1 includes a common terminal 63, a first terminal 61, and a second terminal 62. An antenna element 9 is electrically connected to the common terminal 63.

The first filter device 10 and the inductor L1 are electrically connected in series on a first path C1 electrically connecting the common terminal 63 and the first terminal 61. The inductor L1 is electrically connected between the first filter device 10 and the first terminal 61. The inductor L1 is an element which matches or substantially matches an impedance between the first filter device 10 and a power amplifier 6.

The second filter device 20 and the inductor L2 are electrically connected in series on a second path C2 electrically connecting the common terminal 63 and the second terminal 62. The inductor L2 is electrically connected between the common terminal 63 and the second filter device 20. The inductor L2 is an element which matches or substantially matches an impedance between the antenna element 9 and the second filter device 20. The first path C1 and the second path C2 are commonly connected to each other at a node n1.

The front end circuit 5 includes the multiplexer 1, the power amplifier 6, and a low-noise amplifier 7. An RFIC (Radio Frequency Integrated Circuit) 8 is electrically connected to an input side of the power amplifier 6, and the first terminal 61 of the multiplexer 1 is electrically connected to an output side. The second terminal 62 of the multiplexer 1 is electrically connected to an input side of the low-noise amplifier 7, and the RFIC 8 is electrically connected to an output side.

Figure 2:
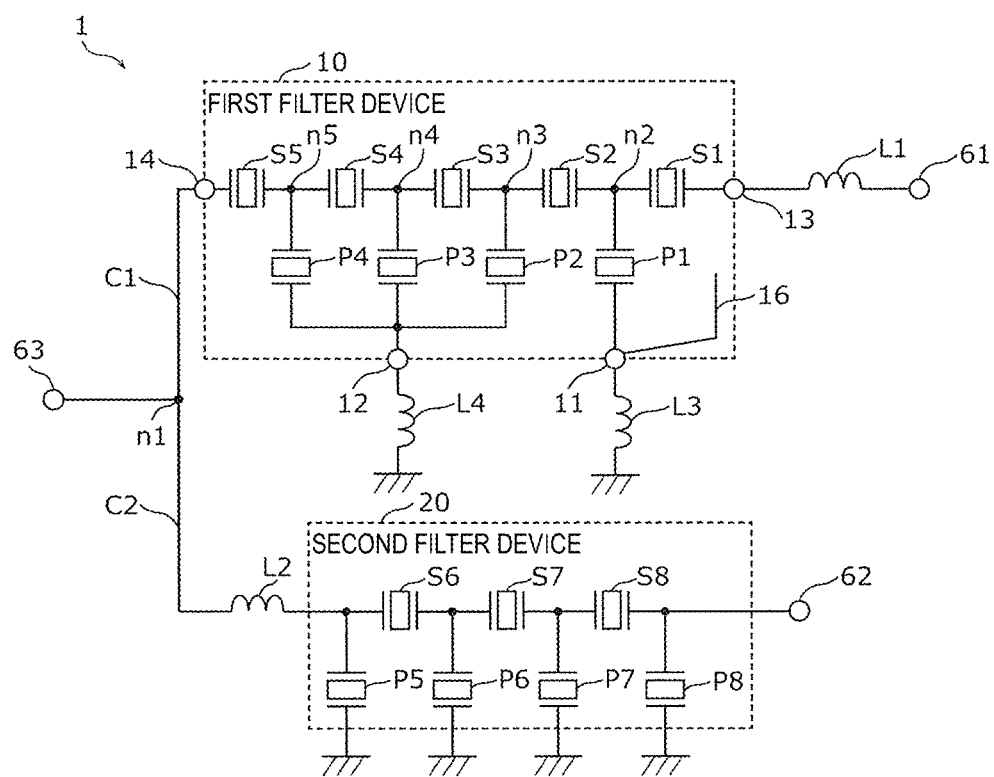
FIG. 2 is a circuit diagram of a multiplexer according to a preferred embodiment of the present invention.

FIG. 2 is a circuit diagram of the multiplexer 1. As described above, the multiplexer 1 includes the first filter device 10, the inductor L1, the second filter device 20, and the inductor L2.

The first filter device 10 is, for example, a ladder transmission filter, filters a high-frequency signal input from the first terminal 61, and outputs the filtered high-frequency signal to the common terminal 63. The first filter device 10 includes an acoustic wave resonator including series resonators S1, S2, S3, S4, and S5 and parallel resonators P1, P2, P3, and P4.

Each of the series resonators S1 to S5 is electrically connected in series to the first path C1 between the first terminal and the node n1. The series resonator S1 is electrically connected in series to the inductor L1 with the first terminal side terminal 13 provided therebetween. Among the plurality of acoustic wave resonators, the series resonator S1 is closest to the first terminal 61 on the first path C1. The series resonator S1 corresponds to a first series resonator.

Each of the parallel resonators P1 to P4 is provided on a path electrically connecting nodes n2, n3, n4, and n5, respectively, on the first path C1 and a ground. Specifically, one end of the parallel resonator P1 is electrically connected to the node n2 between the series resonators S1 and S2, and another end thereof is electrically connected to a first ground terminal 11. The node n2 to which the parallel resonator P1 among the parallel resonators P1 to P4 is electrically connected is closest to the first terminal 61 on the first path C1, and is farthest from the common terminal 63. At this time, the parallel resonator P1 is a parallel resonator closest to the first terminal 61 among the parallel resonators P1 to P4, and corresponds to a first parallel resonator.

One end of the parallel resonator P2 is electrically connected to the node n3 between the series resonators S2 and S3, and another end thereof is electrically connected to a second ground terminal 12. One end of the parallel resonator P3 is electrically connected to the node n4 between the series resonators S3 and S4, and another end thereof is electrically connected to the second ground terminal 12. One end of the parallel resonator P4 is electrically connected to the node n5 between the series resonators S4 and S5, and another end thereof is electrically connected to the second ground terminal 12. The parallel resonators P2 to P4 correspond to a second parallel resonator.

Additionally, the first filter device 10 includes a first terminal side terminal (an amplifier side terminal) 13, a common terminal side terminal (an antenna side terminal) 14, and the first ground terminal 11 and the second ground terminal 12 described above. The first terminal side terminal 13 is electrically connected to the first terminal 61 with the inductor L1 interposed therebetween. The common terminal side terminal 14 is electrically connected to the common terminal 63 with the node n1 interposed therebetween. The first ground terminal 11 is electrically connected to the ground with an inductor L3 interposed therebetween to widen a pass band width of the first filter device 10. The second ground terminal 12 is electrically connected to the ground with an inductor L4 interposed therebetween to highly attenuate a high frequency side of a pass band of the first filter device 10. The second ground terminal 12 is a common terminal to which each other end of the parallel resonators P2 to P4 is electrically connected.

The first ground terminal 11 is not connected to the second ground terminal 12 in the first filter device 10. That is, the first ground terminal 11 and the second ground terminal 12 are terminals independent from each other in the first filter device 10. Note that the first ground terminal 11 and the second ground terminal 12 are electrically connected to a ground terminal 64 provided along a lowermost layer of a multilayer substrate 60 described later.

Further, on the first path C1, the node n2 to which the first ground terminal 11 is electrically connected is located closer to the first terminal 61 side than the nodes n3 to n5 to which the second ground terminal 12 is electrically connected. That is, on the first path C1, the nodes n3 to n5 to which the second ground terminal 12 is electrically connected is located closer to the common terminal 63 side than the node n2 to which the first ground terminal 11 is electrically connected.

In the present preferred embodiment, a shield wire 16 is electrically connected to the first ground terminal 11. The shield wire 16 is a wiring to significantly reduce or prevent electromagnetic field coupling between the inductor L1 and the acoustic wave resonator (the series resonators S1 to S5 and the parallel resonators P1 to P4). The shield wire 16 will be described later.

The second filter device 20 is, for example, a ladder reception filter, filters the high-frequency signal input from the common terminal 63, and outputs the filtered high-frequency signal to the second terminal 62. The second filter device 20 includes an acoustic wave resonator including series resonators S6, S7, and S8 and parallel resonators P5, P6, P7, and P8. Note that the second filter device 20 may be a longitudinally coupled resonator acoustic wave filter or an LC filter.

2. Mounting Structure of Multiplexer

Figure 3:
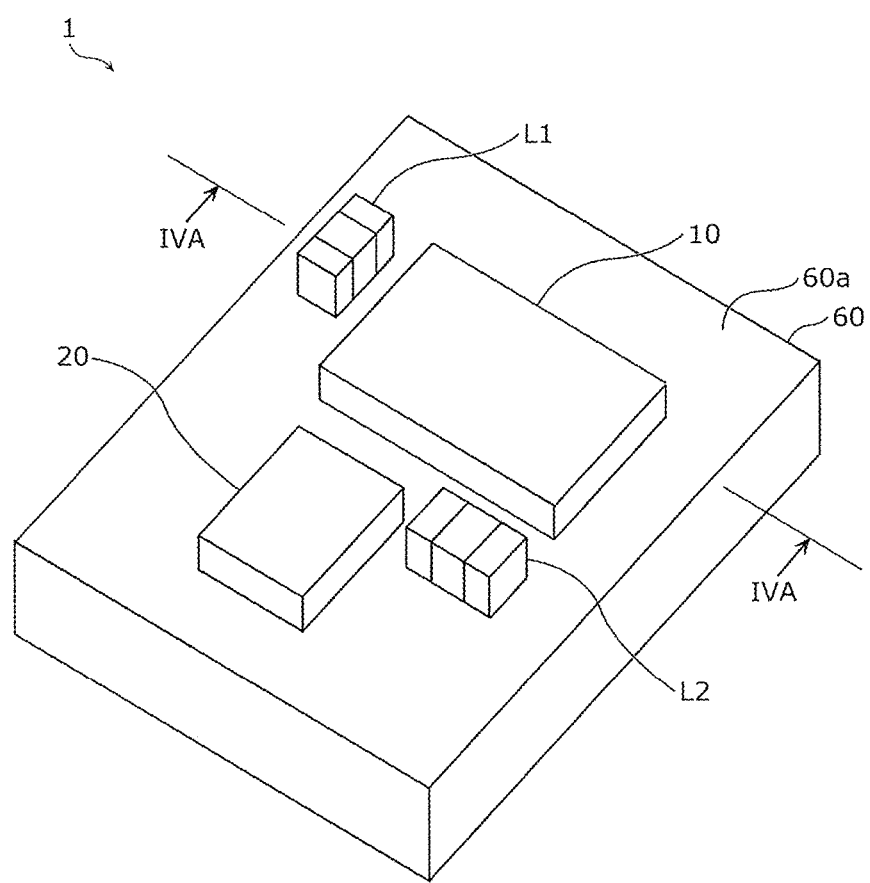
FIG. 3 is a perspective view of a multiplexer according to a preferred embodiment of the present invention.
Figure 4A:
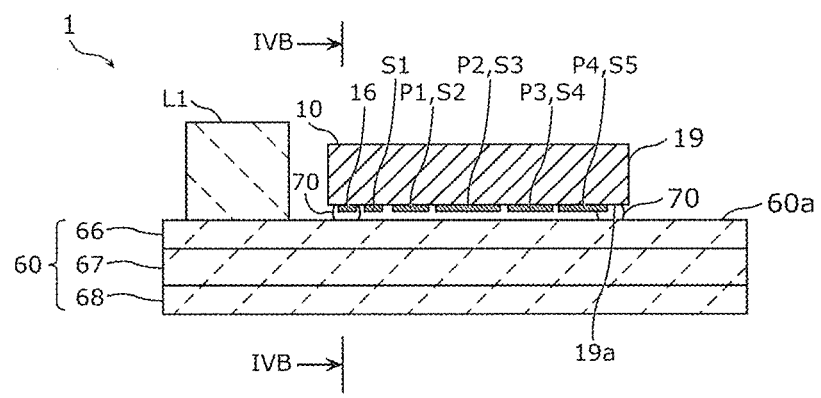
FIG. 4A is a cross-sectional view of the multiplexer according to a preferred embodiment of the present invention taken along a line IVA-IVA in FIG. 3.
Figure 4B:
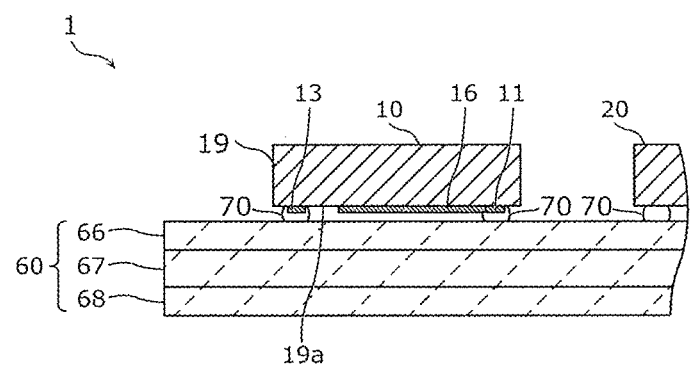
FIG. 4B is a cross-sectional view of the multiplexer according to a preferred embodiment of the present invention taken along a line IVB-IVB in FIG. 4A.
Figure 5A:
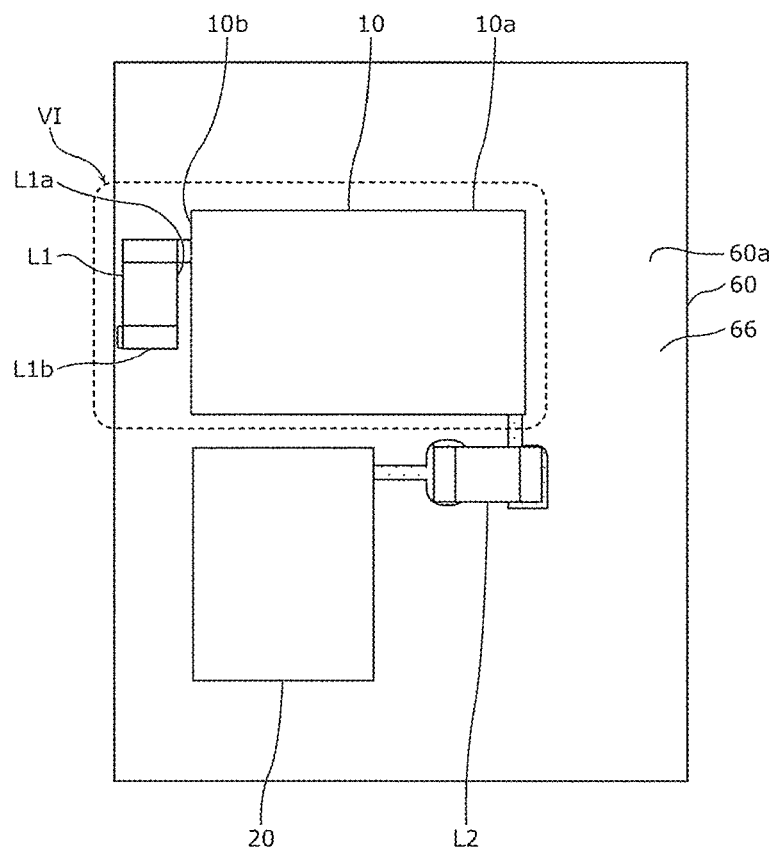
FIG. 5A is a plan view of a multiplexer according to a preferred embodiment of the present invention.

Next, a mounting structure of the multiplexer 1 will be described. FIG. 3 is a perspective view of the multiplexer 1. FIG. 4A is a cross-sectional view of the multiplexer 1 taken along a line IVA-IVA in FIG. 3. FIG. 4B is a cross-sectional view of the multiplexer 1 taken along a line IVB-IVB in FIG. 4A. FIG. 5A is a plan view of the multiplexer 1.

As shown in FIG. 3 and FIG. 5A, the multiplexer 1 includes the multilayer substrate 60, the first filter device 10, the second filter device 20, and the inductors L1 and L2. The first filter device 10, the second filter device 20, the inductors L1 and L2 are mounted on one main surface 60a of the multilayer substrate 60. Further, the multiplexer 1 includes the inductors L3 and L4 provided on the multilayer substrate 60 (not shown).

As shown in FIG. 5A, the first filter device 10 and the inductor L1 are adjacent to each other on the one main surface 60a of the multilayer substrate 60. That is, another electronic component different from the first filter device 10 and the inductor L1 is not mounted between the first filter device 10 and the inductor L1.

Each of the first filter device 10 and the inductor L1 has a rectangular or substantially rectangular shape when viewed in a plan view, the first filter device 10 includes a long side 10a and a short side 10b, and the inductor L1 includes a long side L1a and a short side L1b. The long side L1a of the inductor L1 is parallel or substantially parallel to the short side 10b of the first filter device 10.

The first filter device 10 is, for example, an acoustic wave device having a rectangular parallelepiped or substantially rectangular parallelepiped shape. As shown in FIGS. 4A and 4B, the first filter device 10 includes a substrate 19 having piezoelectricity. The series resonators S1 to S5 and the parallel resonators P1 to P4 are provided on one main surface 19a of the substrate 19. Further, the first ground terminal 11, the first terminal side terminal 13, and the shield wire 16 are provided on the one main surface 19a of the substrate 19. Additionally, although not shown in FIGS. 4A and 4B, the second ground terminal 12 and the common terminal side terminal 14 are provided on the main surface 19a. The first filter device 10 is electrically connected to a land of an uppermost layer 66 with a bonding material 70, for example, solder, provided therebetween. The one main surface 19a of the substrate 19 and the one main surface 60a of the multilayer substrate 60 face each other with a space provided therebetween.

Each of the inductors L1 and L2 is a multilayer chip inductor including, for example, a plurality of coil patterns being electrically connected to each other with vias. The inductors L1 and L2 may be a wire-wound inductor provided by winding wires. For example, an inductance value of the inductor L1 is preferably about 3.5 nH. The inductance value of the inductor L1 is larger than the inductance value of the inductors L3 and L4.

The inductors L1 and L2 are respectively electrically connected to lands of the main surface 60a of the multilayer substrate 60 by, for example, solder or the like. A coil axis of each of the inductors L1 and L2 is perpendicular or substantially perpendicular to the main surface 60a of the multilayer substrate 60.

The multilayer substrate 60 is a multilayer body including a plurality of ceramic substrates or a multilayer body including a plurality of substrates that include resin. The multilayer substrate 60 includes three ceramic substrates, i.e., the uppermost layer 66, an intermediate layer 67, and a lowermost layer 68, as shown in FIGS. 4A and 4B. The multilayer substrate 60 is not limited to a substrate of three layers, and may be of four or more layers.

Figure 5B:
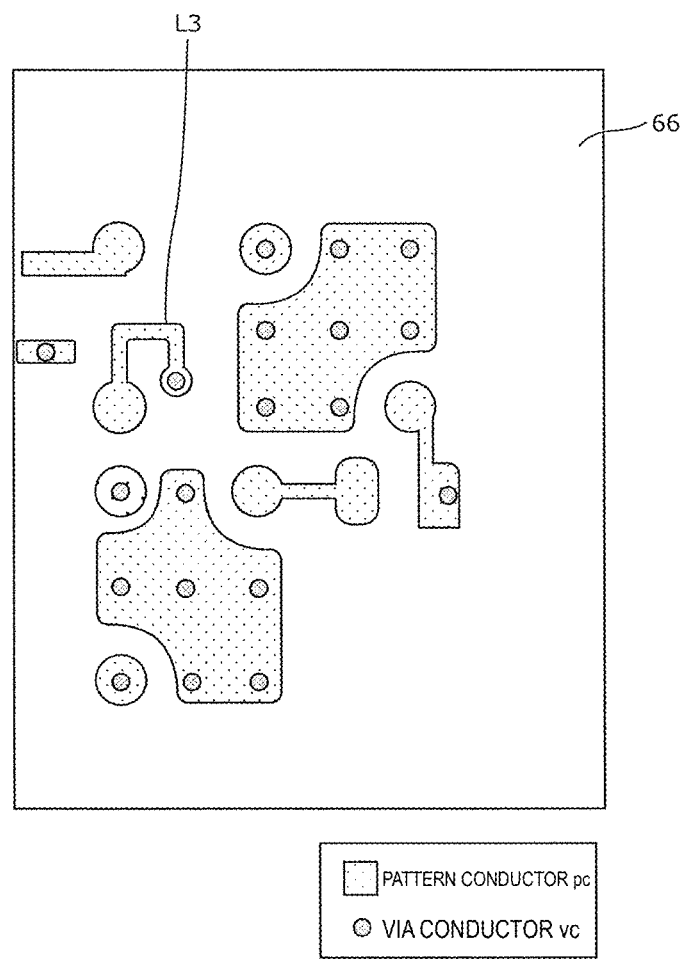
FIG. 5B is a plan view showing an uppermost layer of a multilayer substrate of a multiplexer according to a preferred embodiment of the present invention.
Figure 5C:
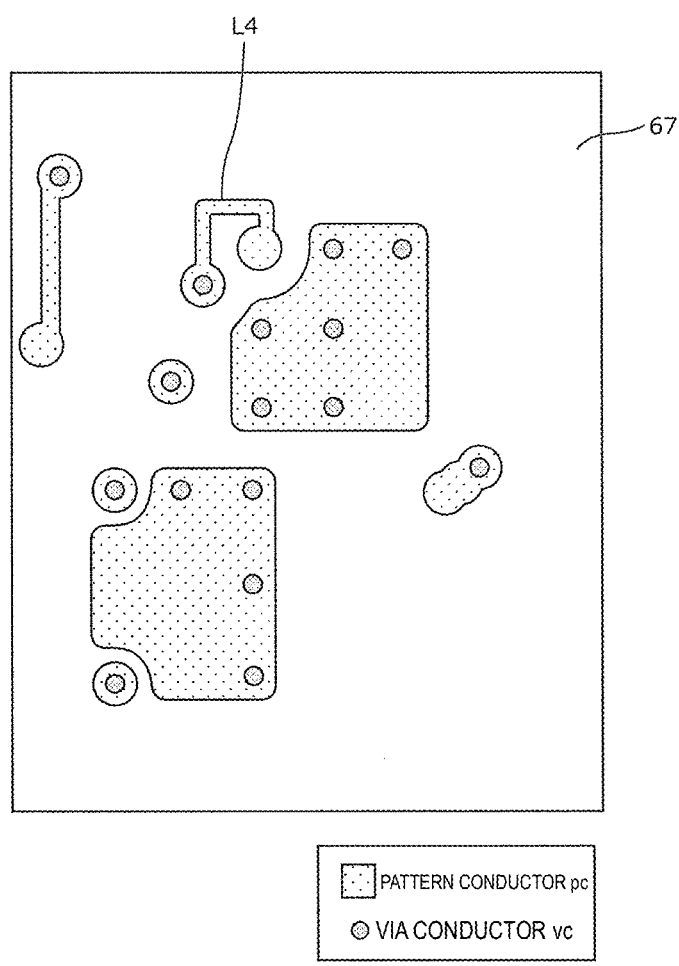
FIG. 5C is a plan view showing an intermediate layer of a multilayer substrate of the multiplexer according to a preferred embodiment of the present invention.
Figure 5D:
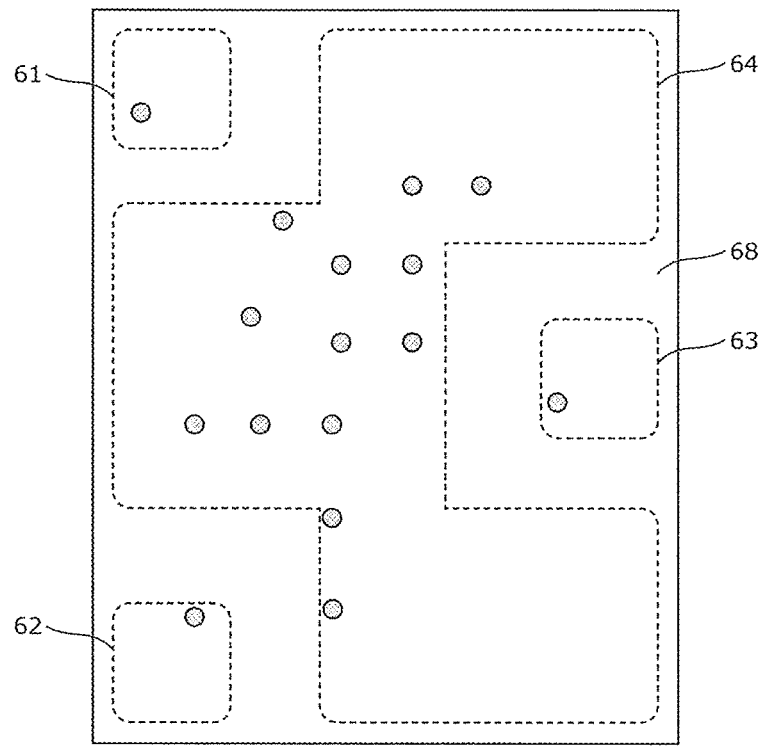
FIG. 5D is a plan view showing a lowermost layer of a multilayer substrate of the multiplexer according to a preferred embodiment of the present invention.

FIG. 5B is a plan view showing the uppermost layer 66 of the multilayer substrate 60. FIG. 5C is a plan view showing the intermediate layer 67 of the multilayer substrate 60. FIG. 5D is a plan view showing the lowermost layer 68 of the multilayer substrate 60.

A plurality of pattern conductors pc and a plurality of via conductors vc preferably including a conductive material, for example, Cu or Ag are provided in each of the uppermost layer 66, the intermediate layer 67, and the lowermost layer 68.

As shown in FIG. 5B, the inductor L3 is provided in the uppermost layer 66. For example, the inductor L3 is the pattern conductor pc having a ¾-turn coil shape. Further, in the uppermost layer 66, lands to mount the first filter device 10, the second filter device 20, the inductors L1 and the L2, and a wiring to electrically connect the first filter device 10 to the inductor L1 are provided. As shown in FIG. 5C, the inductor L4 is provided in the intermediate layer 67. The inductor L4 is the pattern conductor pc having a ¾-turn coil shape. The first terminal 61, the second terminal 62, the common terminal 63, and the ground terminal 64 are provided on a bottom surface (back surface) of the lowermost layer 68 (see FIG. 5D).

3. Structure of First Filter Device

Figure 6:
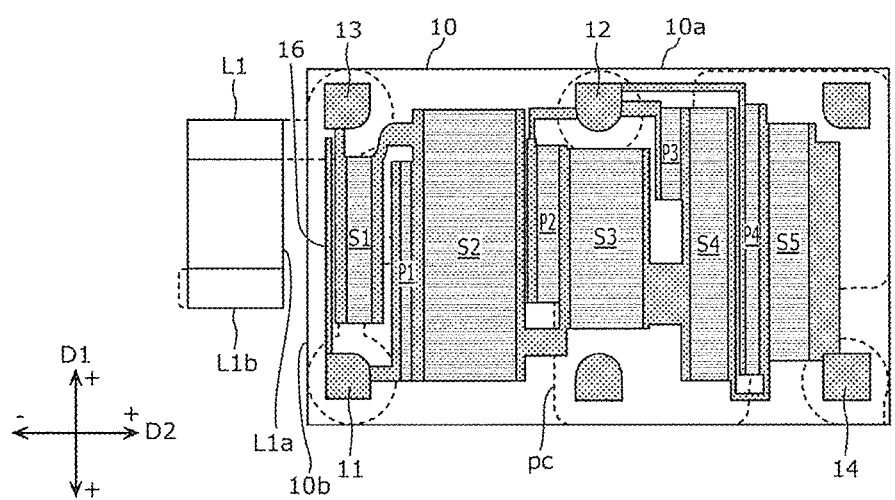
FIG. 6 is a diagram showing an electrode layout of a first filter device of a multiplexer according to a preferred embodiment of the present invention.

Next, a structure of the first filter device 10 will be described. FIG. 6 is a diagram showing an electrode layout of the first filter device 10, and specifically, a perspective view of a VI portion of the multiplexer 1 shown in FIG. 5A.

FIG. 6 shows the series resonators S1 to S5, the parallel resonators P1 to P4, the first ground terminal 11, the second ground terminal 12, the first terminal side terminal 13, and the common terminal side terminal 14 of the first filter device 10. The first ground terminal 11, the second ground terminal 12, the first terminal side terminal 13, and the common terminal side terminal 14 are located in an outer peripheral region of the first filter device 10 in a plan view. The series resonators S1 to S5 and the parallel resonators P1 to P4 are located inside the outer peripheral region in a plan view.

The first terminal side terminal 13 and the first ground terminal 11 are located at a position adjacent to or in a vicinity of the inductor L1, and the common terminal side terminal 14 is located at a position distant from the inductor L1. The second ground terminal 12 is located at a position closer to the common terminal side terminal 14 than the first ground terminal 11.

Each of the series resonators S1 to S5 and the parallel resonators P1 to P4 is defined by an interdigital transducer (IDT) electrode including a pair of comb-shaped electrodes facing each other. The interdigital transducer electrode is provided on the main surface 19a side of the substrate 19. Note that, for example, a silicon oxide film or the like may be provided between the substrate 19 and the interdigital transducer electrode.

Each comb-shaped electrode includes a plurality of electrode fingers extending along a direction D2 orthogonal or substantially orthogonal to a propagation direction D1 of the acoustic wave and a busbar electrode connecting each end portion of the plurality of electrode fingers. The electrode fingers of the pair of comb-shaped electrodes of the interdigital transducer electrode are interdigitated with each other. Hereinafter, in FIG. 6, the busbar electrode positioned on a negative side in the direction D2 when viewed from the electrode finger of each resonator is referred to as one busbar, and the busbar electrode positioned on a positive side in the direction D2 is referred to as another busbar.

One busbar of the series resonator S1 is electrically connected to the first terminal side terminal 13, and another busbar of the series resonator S1 is electrically connected to one busbar of the series resonator S2. The one busbar of the series resonator S2 is electrically connected to the parallel resonator P1, and another busbar of the series resonator S2 is electrically connected to one busbar of the series resonator S3. One busbar of the parallel resonator P1 is electrically connected to the first ground terminal 11. The shield wire 16 is electrically connected to the first ground terminal 11.

The shield wire 16 is provided between the inductor L1 and the series resonator S1 when the first filter device 10 is viewed in a plan view. In addition, the shield wire 16 intersects with a straight line connecting the inductor L1 and each acoustic wave resonator when the first filter device 10 is viewed in a plan view. Specifically, the shield wire 16 is provided along the propagation direction D1. The shield wire 16 is not limited to one wire, and may be a plurality of shield wires.

The one busbar of the series resonator S3 is electrically connected to the parallel resonator P2, and another busbar of the series resonator S3 is electrically connected to one busbar of the series resonator S4. The one busbar of the series resonator S4 is electrically connected to the parallel resonator P3, and another busbar of the series resonator S4 is electrically connected to one busbar of the series resonator S5. The one busbar of the series resonator S5 is electrically connected to the parallel resonator P4, and another busbar of the series resonator S5 is electrically connected to the common terminal side terminal 14. One busbar of the parallel resonator P2, one busbar of the parallel resonator P3, and one busbar of the parallel resonator P4 are electrically connected to the second ground terminal 12.

In the multiplexer 1 according to the present preferred embodiment, when the first filter device 10 is viewed in a plan view, the shield wire 16 is provided between the inductor L1 and the acoustic wave resonator (any resonator of the series resonators S1 to S5 and the parallel resonators P1 to P4). According to this structure, the electromagnetic field coupling between the inductor L1 and the acoustic wave resonator is able to be significantly reduced or prevented, and unnecessary waves generated outside the pass band of the first filter device 10 are able to be significantly reduced or prevented. Accordingly, the unnecessary wave transmission to the second filter device 20 is significantly reduced or prevented, and isolation in the pass band of the second filter device 20 is able to be improved.

For example, as shown in FIG. 1, when the power amplifier 6 is electrically connected to the inductor L1, a large current flows through the inductor L1, and even in this case, the shield wire 16 is provided between the inductor L1 and the acoustic wave resonator, and electromagnetic field coupling is able to be significantly reduced or prevented.

In addition, the shield wire 16 in the present preferred embodiment is provided between the inductor L1 and the acoustic wave resonator when the first filter device 10 is viewed in a plan view. Therefore, for example, in the present preferred embodiment, the first filter device 10 and multiplexer 1 is able to be significantly reduced in size as compared with a case where the shield surrounds the entire circumference of the acoustic wave resonator.

In addition, the shield wire 16 in the present preferred embodiment is electrically connected to the first ground terminal 11 electrically connected to the parallel resonator P1. Therefore, there is no need to provide an additional ground electrode for the shield wire 16, and the first filter device 10 and the multiplexer 1 is able to be significantly reduced in size.

Further, in the present preferred embodiment, the shield wire 16 is electrically connected to the first ground terminal 11, and the first ground terminal 11 is not connected to the second ground terminal 12. For example, in a case where the first ground terminal 11 and the second ground terminal 12 are connected to each other, a problem may arise that a leakage current generated in the shield wire 16 enters the common terminal 63 side through the first ground terminal 11, the second ground terminal 12, and the parallel resonators P2 to P4. In contrast, in the present preferred embodiment, since the first ground terminal 11 and the second ground terminal 12 are not connected to each other, a transmission path of the leakage current becomes long, and the leakage current hardly enters the common terminal 63 side. Accordingly, the isolation in the pass band of the second filter device 20 is able to be significantly increased.

4. Evaluation Results and the Like

Hereinafter, evaluation results (simulation results) of the multiplexer 1 according to the present preferred embodiment will be described as compared with first and second comparative examples.

Figure 7:
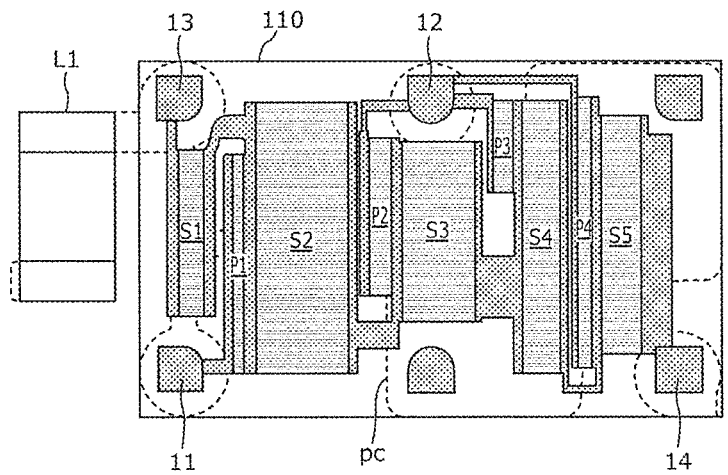
FIG. 7 is a diagram showing an electrode layout of a first filter device according to a first comparative example.

FIG. 7 is a diagram showing an electrode layout of a first filter device 110 according to the first comparative example. The first filter device 110 of the first comparative example does not have the shield wire 16.

Figure 8:
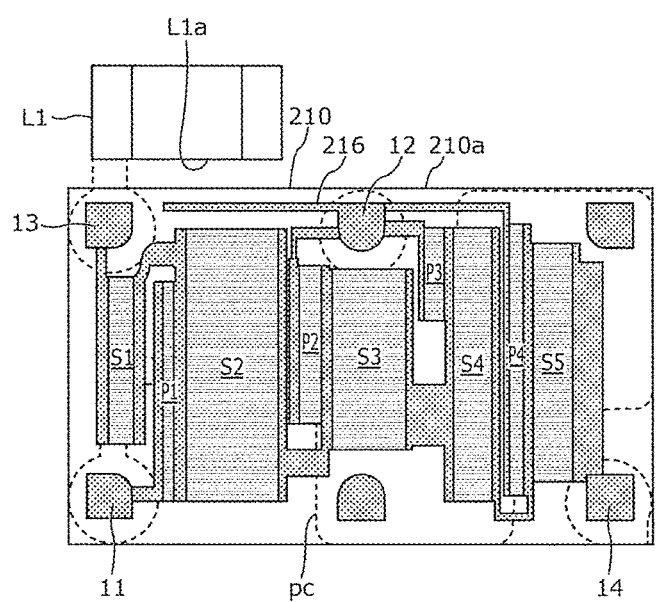
FIG. 8 is a diagram showing an electrode layout of a first filter device according to a second comparative example.

FIG. 8 is a diagram showing an electrode layout of a first filter device 210 according to the second comparative example. The first filter device 210 of the second comparative example includes a shield wire 216, and the shield wire 216 is electrically connected to the second ground terminal 12.

Figure 9:
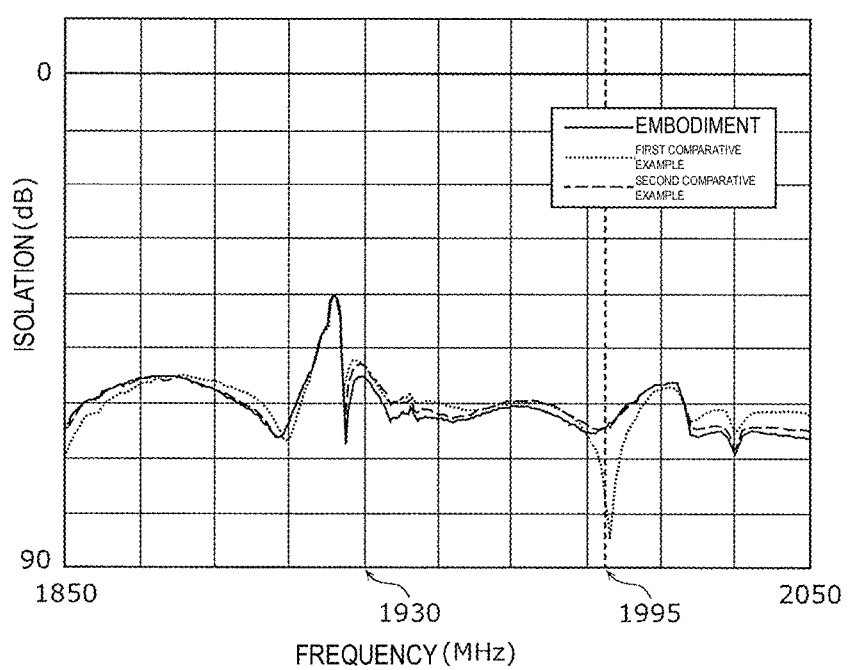
FIG. 9 is a diagram showing isolation characteristics in an Rx band of a multiplexer according to a preferred embodiment of the present invention.

FIG. 9 is a diagram showing isolation characteristics in an Rx band of the multiplexer 1. As shown in FIG. 9, an isolation value in the frequency pass band (for example, about 1930 MHz to about 1995 MHz) of the second filter device 20 is about 55.6 dB in the present preferred embodiment, about 53.3 dB in the first comparative example, and about 53.5 dB in the second comparative example. The present preferred embodiment has improved isolation as compared to the first and second comparative examples.

As in the present preferred embodiment, by providing the shield wire 16 between the inductor L1 and the acoustic wave resonator, the isolation in the pass band of the second filter device 20 is able to be improved. Further, as in the present preferred embodiment, due to the first ground terminal 11 electrically connected to the shield wire 16 being independent from the second ground terminal 12, the isolation in the pass band of the second filter device 20 is able to be significantly increased.

Although the multiplexer 1 according to the present preferred embodiment of the present invention has been described above, the present invention is not limited to the above preferred embodiment. For example, a mode provided by applying the following modifications to the above preferred embodiment may also be included in the present invention.

For example, although a duplexer is exemplified as an example of a multiplexer in the above preferred embodiment, the present invention is not limited thereto, and may be a multiplexer in which a plurality of transmission filters are electrically connected in common, or a multiplexer in which a plurality of reception filters are electrically connected in common.

In the first filter device 10 of the above preferred embodiment, an example in which an acoustic wave resonator is provided on the one main surface 19a of the substrate 19 is described, but the present invention is not limited thereto, and, for example, the first filter device 10 may be an acoustic wave device of a WLP (Wafer Level Package) type.

In the above preferred embodiment, the long side L1a of the inductor L1 is parallel or substantially parallel to the short side 10b of the first filter device 10, but the present invention is not limited thereto. For example, the long side L1a of the inductor L1 may be parallel or substantially parallel to a long side 210a of the first filter device 210. Accordingly, the shield wire 16 may be extended from the first ground terminal 11 and may be only provided between the inductor L1 and the acoustic wave resonator (the series resonators S1 and S2 and the parallel resonator P1).

In the multiplexer 1 in the above preferred embodiment, an example in which the shield wire is not provided around the inductor L2 is described, but the present invention is not limited thereto. For example, a shield wire may be provided between the inductor L2 and the acoustic wave resonator of the first filter device 10. However, when the multiplexer 1 is a duplexer, since a low power high-frequency signal is input to the inductor L2, there is little influence due to the electromagnetic field coupling, and it is not necessary to provide a shield wire between the inductor L2 and the acoustic wave resonator.

The present invention is widely applicable to a communication device, for example, a mobile phone as a multiplexer applicable to a multiband and multimode frequency standard.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:
a common terminal, a first terminal, and a second terminal;
a first filter device including a plurality of acoustic wave resonators including one or more series resonators provided on a first path electrically connecting the common terminal and the first terminal, and two or more parallel resonators provided on one or more second paths electrically connecting the first path and a ground;
an inductor provided between an acoustic wave resonator closest to the first terminal among the plurality of acoustic wave resonators and the first terminal, on the first path; and
a second filter device provided on a third path electrically connecting the common terminal and the second terminal; wherein
the first filter device further includes:
a first ground terminal to which a first parallel resonator closest to the first terminal among the two or more parallel resonators is electrically connected, on the first path;
a second ground terminal to which a second parallel resonator different from the first parallel resonator among the two or more parallel resonators is electrically connected; and
a wiring provided between the inductor and the plurality of acoustic wave resonators when the first filter device is viewed in a plan view; and
in the first filter device, the wiring is electrically connected to the first ground terminal separately from the plurality of acoustic wave resonators, and the first ground terminal is not connected to the second ground terminal.

2. The multiplexer according to claim 1, further comprising:
a multilayer substrate; wherein
the common terminal, the first terminal, and the second terminal are provided on the multilayer substrate; and
the first filter device, the inductor, and the second filter device are mounted on one main surface of the multilayer substrate.

3. The multiplexer according to claim 2, wherein
the first filter device includes a substrate having piezoelectricity; and
the wiring and the first ground terminal are provided on one main surface of the substrate.

4. The multiplexer according to claim 2, wherein, between the first filter device and the inductor, another electronic component different from the first filter device and the inductor is not mounted, and the first filter device and the inductor are adjacent to each other.

5. The multiplexer according to claim 1, wherein the inductor is electrically connected between a power amplifier electrically connected to the first terminal and the first filter device.

6. The multiplexer according to claim 5, wherein a radio frequency integrated circuit is electrically connected to an input terminal of the power amplifier.

7. The multiplexer according to claim 5, wherein the inductor matches or substantially matches an impedance of the first filter device and an impedance of the power amplifier.

8. The multiplexer according to claim 1, wherein
an acoustic wave resonator closest to the first terminal is a first series resonator closest to the first terminal among the one or more series resonators; and
the wiring is provided between the inductor and the first series resonator when the first filter device is viewed in a plan view.

9. The multiplexer according to claim 1, wherein the wiring intersects with a straight line connecting the inductor and the plurality of acoustic wave resonators when the first filter device is viewed in a plan view.

10. The multiplexer according to claim 1, wherein the inductor is a chip inductor or a wire-wound inductor.

11. The multiplexer according to claim 1, wherein
each of the first filter device and the inductor has a rectangular or substantially rectangular shape when viewed in a plan view; and
a long side of the inductor is parallel or substantially parallel to a long side or a short side of the first filter device.

12. The multiplexer according to claim 1, wherein the first filter device is a transmission filter, and the second filter device is a reception filter.

13. The multiplexer according to claim 1, wherein an output terminal of a first amplifier is electrically connected to the first terminal and an input terminal of a second amplifier is electrically connected to the second terminal.

14. The multiplexer according to claim 1, wherein the second filter is electrically connected in series with a second inductor on the third path.

15. The multiplexer according to claim 1, wherein the first filter device is a ladder transmission filter.

16. The multiplexer according to claim 1, wherein the second filter device is a ladder reception filter.

17. The multiplexer according to claim 1, wherein the second filter device includes an acoustic wave resonator including a plurality of series resonators and a plurality of parallel resonators.

18. The multiplexer according to claim 1, wherein each of the one or more series resonators and the two or more parallel resonators of the first filter device is defined by an interdigital transducer (IDT) electrode.

* * * * *